(12) United States Patent
Lim et al.

(10) Patent No.: US 10,298,235 B2
(45) Date of Patent: May 21, 2019

(54) LOW POWER INTEGRATED CLOCK GATING CELL USING CONTROLLED INVERTED CLOCK

(71) Applicant: Samsung Electronics Co., Ltd., Suwon-si, Gyeonggi-do (KR)

(72) Inventors: James Jung Lim, Austin, TX (US); Matthew Berzins, Cedar Park, TX (US)

(73) Assignee: SAMSUNG ELECTRONICS CO., LTD. (KR)

( * ) Notice: Subject to any disclaimer, the term of this patent is extended or adjusted under 35 U.S.C. 154(b) by 45 days.

(21) Appl. No.: 15/629,729

(22) Filed: Jun. 21, 2017

(65) Prior Publication Data
US 2018/0287610 A1    Oct. 4, 2018

Related U.S. Application Data

(60) Provisional application No. 62/480,507, filed on Apr. 2, 2017.

(51) Int. Cl.
*H03K 3/356* (2006.01)
*H03K 19/00* (2006.01)
*H03K 23/58* (2006.01)

(52) U.S. Cl.
CPC ......... *H03K 19/0013* (2013.01); *H03K 23/58* (2013.01)

(58) Field of Classification Search
None
See application file for complete search history.

(56) References Cited

U.S. PATENT DOCUMENTS

| | | | |
|---|---|---|---|
| 7,138,842 B2 | 11/2006 | Padhye et al. | |
| 7,279,935 B2 | 10/2007 | Hamdan et al. | |
| 8,030,982 B2 | 10/2011 | Datta et al. | |
| 8,975,949 B2 | 3/2015 | Berzins et al. | |
| 9,018,995 B2 | 4/2015 | Subramani et al. | |
| 9,246,489 B1 | 1/2016 | Nandi et al. | |
| 9,331,680 B2 | 5/2016 | Gurumurthy et al. | |
| 9,362,910 B2 | 6/2016 | Gurumurthy et al. | |
| 9,455,710 B2 | 9/2016 | Riexinger et al. | |
| 9,467,120 B1* | 10/2016 | Song | G06F 1/3237 |
| 9,564,897 B1 | 2/2017 | Berzins et al. | |
| 9,899,066 B2* | 2/2018 | Bartling | G06F 13/00 |
| 2014/0184271 A1 | 7/2014 | Gurumurthy et al. | |

(Continued)

*Primary Examiner* — Lincoln D Donovan
*Assistant Examiner* — Khareem E Almo
(74) *Attorney, Agent, or Firm* — Renaissance IP Law Group LLP (57) ABSTRACT

Embodiments include an integrated clock gating (ICG) cell. The low power ICG cell may include an input condition determination circuit configured to generate a temporary inverted clock signal and an inverted output signal. The low power ICG cell may include an enable control logic circuit configured to receive the temporary inverted clock signal and the inverted output signal from the input condition determination circuit. The low power ICG cell may include a latch circuit coupled to the enable control logic circuit and configured to latch an input value dependent on at least the inverted output signal and the temporary inverted clock signal. The input condition determination circuit is configured to generate the temporary inverted clock signal only when it is needed.

17 Claims, 7 Drawing Sheets

(56) References Cited

U.S. PATENT DOCUMENTS

2016/0077544 A1   3/2016  Tzeng et al.
2016/0211846 A1   7/2016  Rasouli et al.
2016/0373112 A1  12/2016  Hwang et al.
2018/0123568 A1*  5/2018  Rasouli .................. H03K 3/012
2018/0167058 A1*  6/2018  Rasouli ............ H03K 3/356104

* cited by examiner

LOW POWER INTEGRATED CLOCK GATING CELL USING CONTROLLED INVERTED CLOCK

RELATED APPLICATION DATA

This application claims the benefit of U.S. Provisional Patent Application Ser. No. 62/480,507, filed on Apr. 2, 2017, which is hereby incorporated by reference.

FIELD

The present disclosure relates to digital circuits, and more particularly, to a low power integrated clock gating cell using a controlled inverted clock.

BACKGROUND

Clock gating is a common technique for reducing clock power by shutting off the clock to digital circuit modules by a clock enable signal. A convention approach such as an integrated clock gating cell (ICG) reduces clock power by passing the clock signal only when the ICG is enabled. A conventional ICG uses a clock signal to control the latch, and thus, consumes significant clock switching power. The conventional ICG may use a clock and an inverted clock signal to pass an enable data signal to a latch. Using an inverted clock increases clock power since the ICG is toggling every time the clock switches.

SUMMARY

Embodiments include a low power integrated clock gating (ICG) cell. The low power ICG cell may include an input condition determination circuit configured to generate a temporary inverted clock signal and an inverted output signal. The low power ICG cell may include an enable control logic circuit configured to receive the temporary inverted clock signal and the inverted output signal from the input condition determination circuit. The low power ICG cell may include a latch circuit coupled to the enable control logic circuit and configured to latch an input value dependent on at least the inverted output signal and the temporary inverted clock signal. The input condition determination circuit is configured to generate the temporary inverted clock signal only when it is needed.

BRIEF DESCRIPTION OF THE DRAWINGS

The foregoing and additional features and advantages of the present disclosure will become more readily apparent from the following detailed description, made with reference to the accompanying figures, in which.

DETAILED DESCRIPTION

Reference will now be made in detail to various embodiments, examples of which are illustrated in the accompanying drawings. In the following detailed description, numerous specific details are set forth to enable a thorough understanding of the embodiments. It should be understood, however, that persons having ordinary skill in the art may practice the embodiments without these specific details. In other instances, well-known methods, procedures, components, circuits, and networks have not been described in detail so as not to unnecessarily obscure aspects of the embodiments.

It will be understood that, although the terms first, second, etc. may be used herein to describe various elements, these elements should not be limited by these terms. These terms are only used to distinguish one element from another. For example, a first circuit could be termed a second circuit, and, similarly, a second circuit could be termed a first circuit, without departing from the scope of the embodiments.

The terminology used in the description of the embodiments herein is for the purpose of describing particular embodiments only and is not intended to be limiting of the embodiments. As used in the description of the embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The components and features of the drawings are not necessarily drawn to scale.

Figure 1:
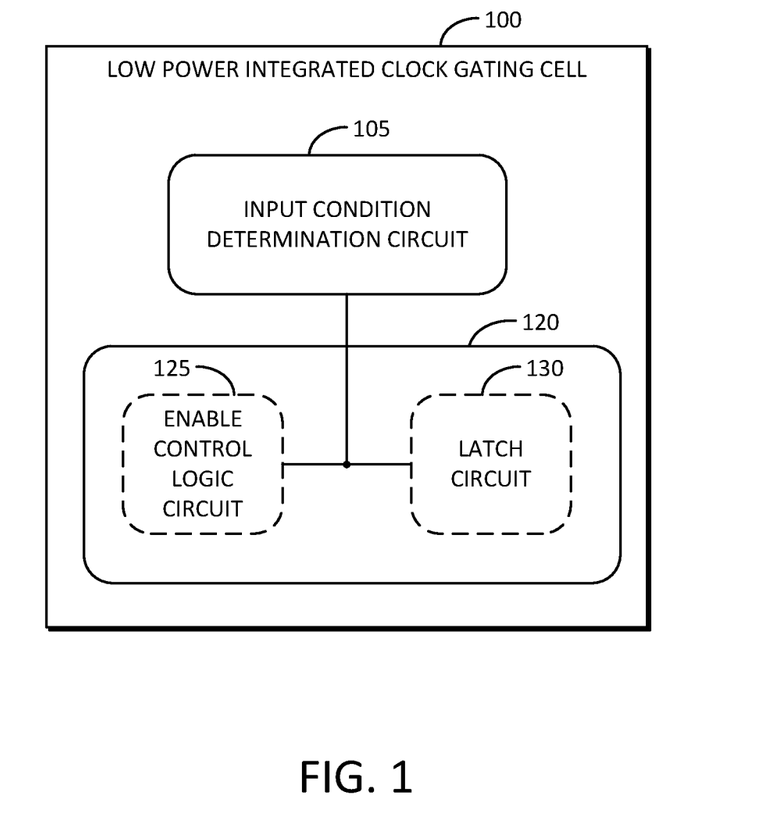
FIG. 1 is an example block diagram of a low power integrated clock gating cell in accordance with some embodiments.

FIG. 1 is an example block diagram of a low power integrated clock gating (ICG) cell 100 in accordance with some embodiments. The low power ICG cell 100 may include an input condition determination circuit 105 and an enable logic and latch circuit 120 having an enable control logic circuit 125 and a latch circuit 130, examples of which are described in detail below. The input condition determination circuit 105, the enable control logic circuit 125, and the latch circuit 130 may be coupled to each other and may communicate with each other.

Figure 2A:
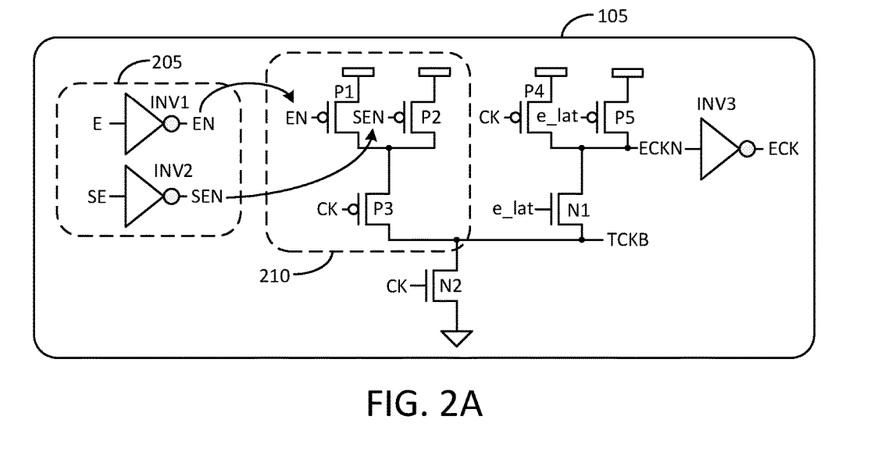
FIG. 2A is an example circuit diagram of an input condition determination circuit of the low power integrated clock gating cell of FIG. 1 in accordance with some embodiments.
Figure 2B:
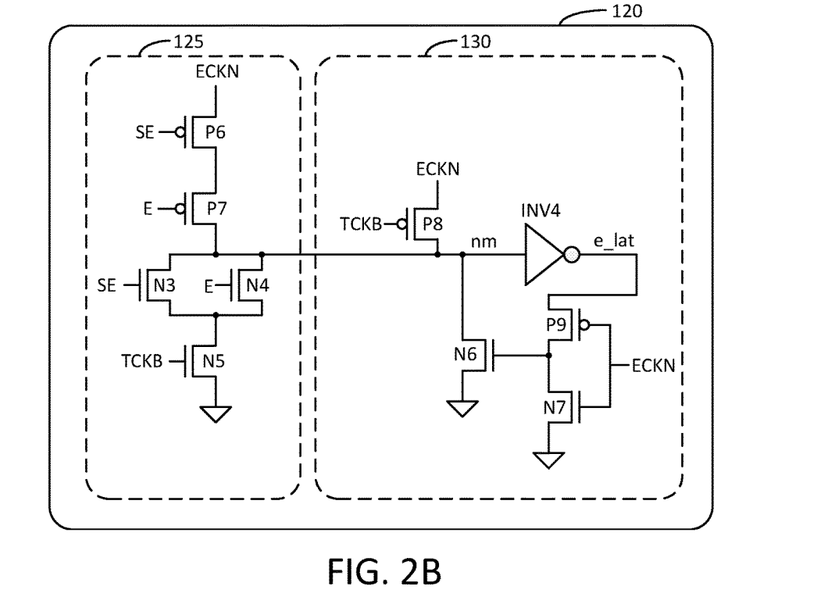
FIG. 2B is an example circuit diagram of an enable logic and latch circuit of the low power integrated clock gating cell of FIG. 1 in accordance with some embodiments.

FIG. 2A is an example circuit diagram of the input condition determination circuit 105 of the low power ICG cell 100 of FIG. 1 in accordance with some embodiments. FIG. 2B is an example circuit diagram of the enable logic and latch circuit 120 of the low power ICG cell 100 of FIG. 1 in accordance with some embodiments. Reference is now made to FIGS. 2A and 2B.

The input condition determination circuit 105 may include an inverter logic circuit 205 and an input condition circuit 210. The inverter logic circuit 205 may include a first inverter INV1, which receives an enable signal E and generates an inverted enable signal EN. The inverter logic circuit 205 may further include a second inverter INV2, which receives a scan enable (SE) signal and generates an inverted SE signal SEN. The input condition circuit 210 may include a first P-type metal-oxide-semiconductor (PMOS) transistor P1, which receives the EN signal at its gate. The input condition circuit 210 may further include a second PMOS transistor P2, which receives the SEN signal at its gate. The input condition circuit 210 may further include a third PMOS transistor P3 coupled to the first and second PMOS transistors P1 and P2. The third PMOS transistor P3 may receive a clock signal CK at its gate.

The input condition determination circuit 105 may further include a fourth PMOS transistor P4, which receives the clock signal CK at its gate. The input condition determination circuit 105 may further include a fifth PMOS transistor P5, which receives an inverted latched enable signal e_lat at its gate. The input condition determination circuit 105 may further include a first N-type metal-oxide-semiconductor (NMOS) transistor N1, which receives the e_lat signal at its gate. The input condition determination circuit 105 may further include a second NMOS transistor N2, which receives the clock signal CK at its gate. The input condition determination circuit 105 may generate an inverted output (ECKN) signal and an inverted clock signal (TCKB). In some embodiments, the ECKN may be inverted using an inverter INV3 to generate a non-inverted output (ECK) signal.

The enable logic and latch circuit 120 may include the enable control logic circuit 125 and the latch circuit 130. The enable control logic circuit 125 may include a sixth PMOS transistor P6 in series with a sixth PMOS transistor P7. The PMOS transistor P6 may receive the SE signal at its gate. The PMOS transistor P7 may receive the E signal at its gate. The enable control logic circuit 125 may further include a third NMOS transistor N3 in parallel with a fourth NMOS transistor N4. The NMOS transistor N3 may receive the SE signal at its gate. The NMOS transistor N4 may receive the E signal at its gate. The drains of the third NMOS transistor N3 and the fourth NMOS transistor N4 are electrically connected to the drain of the sixth PMOS transistor P7 and output an inverted internal latch signal (nm signal). The enable control logic circuit 125 may further include a fifth NMOS transistor N5, which may receive the TCKB signal at its gate.

The latch circuit 130 may include an eighth PMOS transistor P8, which may receive the TCKB signal at its gate. The eighth PMOS transistor P8 receives the ECKN signal at its source. The latch circuit 130 may include a sixth NMOS transistor N6 coupled to the PMOS transistor P8 and to an inverter INV4. A drain of the eighth PMOS transistor P8 is electrically connected to a drain of the sixth NMOS transistor N6 to output the nm signal. The inverter INV4 may receive the nm signal and generate the e_lat signal. The latch circuit 130 may further include a ninth PMOS transistor P9 and a seventh NMOS transistor N7. The gates of the PMOS transistor P9 and the NMOS transistor N7 may receive the ECKN signal. A gate of the NMOS transistor N6 may be coupled to a drain of the PMOS transistor P9 and to a drain of the NMOS transistor N7.

The input condition determination circuit 105 generates the TCKB signal based on the input condition, which is dependent on the inverter logic circuit 205 and the input condition circuit 210. The TCKB signal is only charged when either the enable signal E or the scan enable signal SE has a logical high value. The enable control logic circuit 125 passes an input when the clock (CK) is low. The inverted output signal ECKN and the TCKB signal are used to ensure that the input does not disrupt the latch of the latch circuit 130 when the clock signal CK has a logical high value. Referring to the latch circuit 130, the ECKN signal and the TCKB signal are used to hold the latch. When the ECKN signal remains at a logical high value when the clock signal CK has a logical high value, the inverted internal latch 'nm' signal is pulled to a logical high value. When the ECKN signal is pulled to a logical low value, an inverted latch signal nm is pulled to a logical low value.

Figure 3:
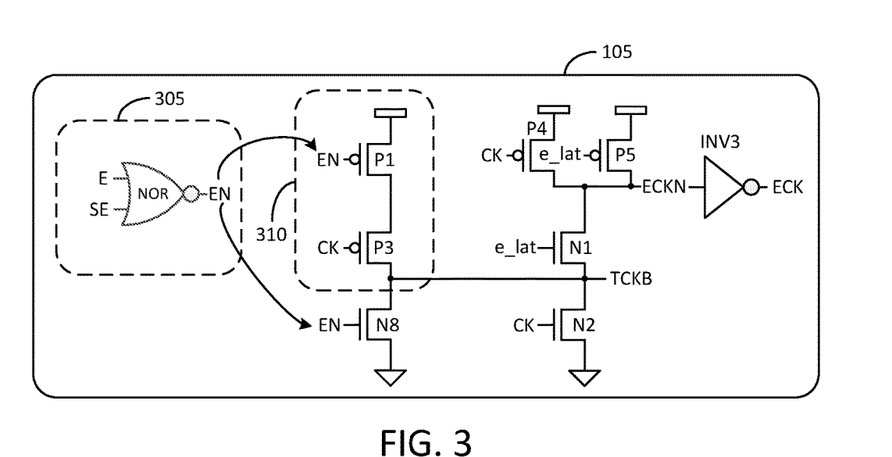
FIG. 3 is another example circuit diagram of an input condition determination circuit of the low power integrated clock gating cell of FIG. 1 in accordance with some embodiments.
Figure 4:
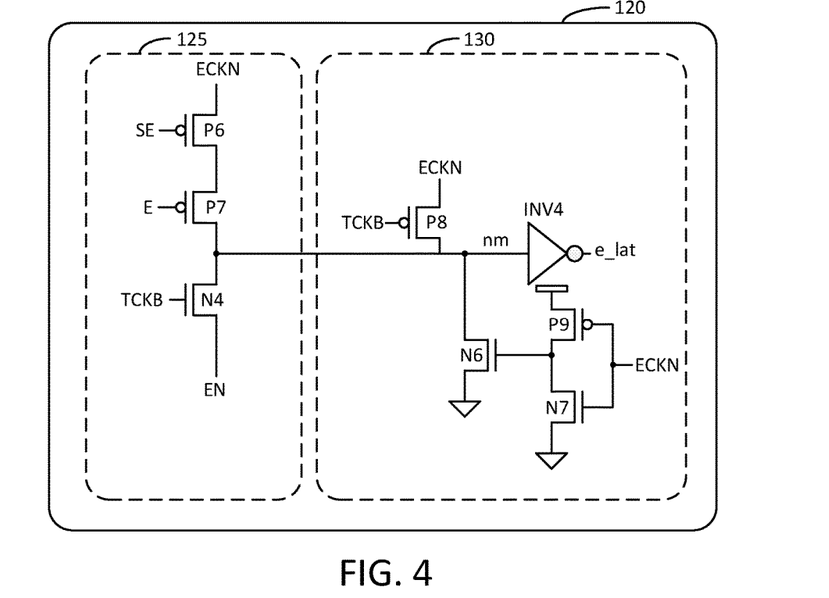
FIG. 4 is another example circuit diagram of an enable logic and latch circuit of the low power integrated clock gating cell of FIG. 1 in accordance with some embodiments.

FIG. 3 is another example circuit diagram of an input condition determination circuit 105 of the low power ICG cell 100 of FIG. 1 in accordance with some embodiments. FIG. 4 is another example circuit diagram of an enable logic and latch circuit 120 of the low power ICG cell 100 of FIG. 1 in accordance with some embodiments. Reference is now made to FIGS. 3 and 4.

The input condition determination circuit 105 may include a NOR logic circuit 305 and an input condition circuit 310. The NOR logic circuit 305 may include a NOR gate, which receives an enable signal E and a scan enable (SE) signal, and generates an inverted enable signal EN. The input condition circuit 310 may include a PMOS transistor P1, which receives the EN signal at its gate. The input condition circuit 310 may further include a PMOS transistor P3, which receives a clock signal CK at its gate.

The input condition determination circuit 105 may further include a PMOS transistor P4, which receives the clock signal CK at its gate. The input condition determination circuit 105 may further include a PMOS transistor P5, which receives an inverted latched enable signal e_lat at its gate. The input condition determination circuit 105 may further include an NMOS transistor N1, which receives the e_lat signal at its gate. The input condition determination circuit 105 may further include an NMOS transistor N2 that receives the clock signal CK at its gate. The input condition determination circuit 105 may further include an NMOS transistor N8 that receives the EN signal at its gate. The input condition determination circuit 105 may generate an inverted output (ECKN) signal and an inverted clock signal (TCKB). In some embodiments, the ECKN may be inverted using an inverter INV3 to generate a non-inverted output (ECK) signal.

The enable logic and latch circuit 120 may include an enable control logic circuit 125 and a latch circuit 130. The enable control logic circuit 125 may include a PMOS transistor P6 in series with a PMOS transistor P7. The PMOS transistor P6 may receive the SE signal at its gate. The PMOS transistor P7 may receive the E signal at its gate. The enable control logic circuit 125 may further include an NMOS transistor N4, which may receive the TCKB signal at its gate. The NMOS transistor N4 may be in series with the PMOS transistors P6 and P7. The drain of the NMOS transistor N4 is electrically connected to the drain of the PMOS transistor P7 to output an inverted internal latch signal (nm signal).

The latch circuit 130 may include a PMOS transistor P8 that may receive the TCKB signal at its gate. The PMOS transistor P8 receives the ECKN signal at its source. The latch circuit 130 may include an NMOS transistor N6 coupled to the PMOS transistor P8 and to an inverter INV4. A drain of the PMOS transistor P8 is electrically connected to a drain of the NMOS transistor N6 to output the nm signal. The inverter INV4 may receive the nm signal and generate the e_lat signal. The latch circuit 130 may further include a PMOS transistor P9 and an NMOS transistor N7. The gates of the PMOS transistor P9 and the NMOS transistor N7 may receive the ECKN signal. A gate of the NMOS transistor N6 may be coupled to a drain of the PMOS transistor P9 and to a drain of the NMOS transistor N7.

The low power ICG cell 100 having the input condition determination circuit 105 of FIG. 3 and the latch circuit 130 of FIG. 4 reduces the number of transistors and saves area as compared to the ICG cell 105 as described in FIGS. 2A and 2B. The input condition determination circuit 105 generates the TCKB signal based on the input condition that is dependent on the NOR logic circuit 305 and/or the input condition circuit 310. The TCKB signal is only charged when either the enable signal E or the scan enable signal SE has a logical high value. As indicated in the enable control logic circuit 125, the series of PMOS and NMOS transistors act as pass gates to pass the ECKN signal and the EN signal to the latch circuit 130. The TCKB signal controls the NMOS transistor N4. As indicated in the latch circuit 130, the ECKN signal and the TCKB signal are used to hold the latch. When the ECKN signal remains at a logical high value when the clock signal CK has a logical high value, the nm signal is pulled to a logical high value. When the ECKN signal is pulled to a logical low value, the nm signal is pulled to a logical low value.

Figure 5:
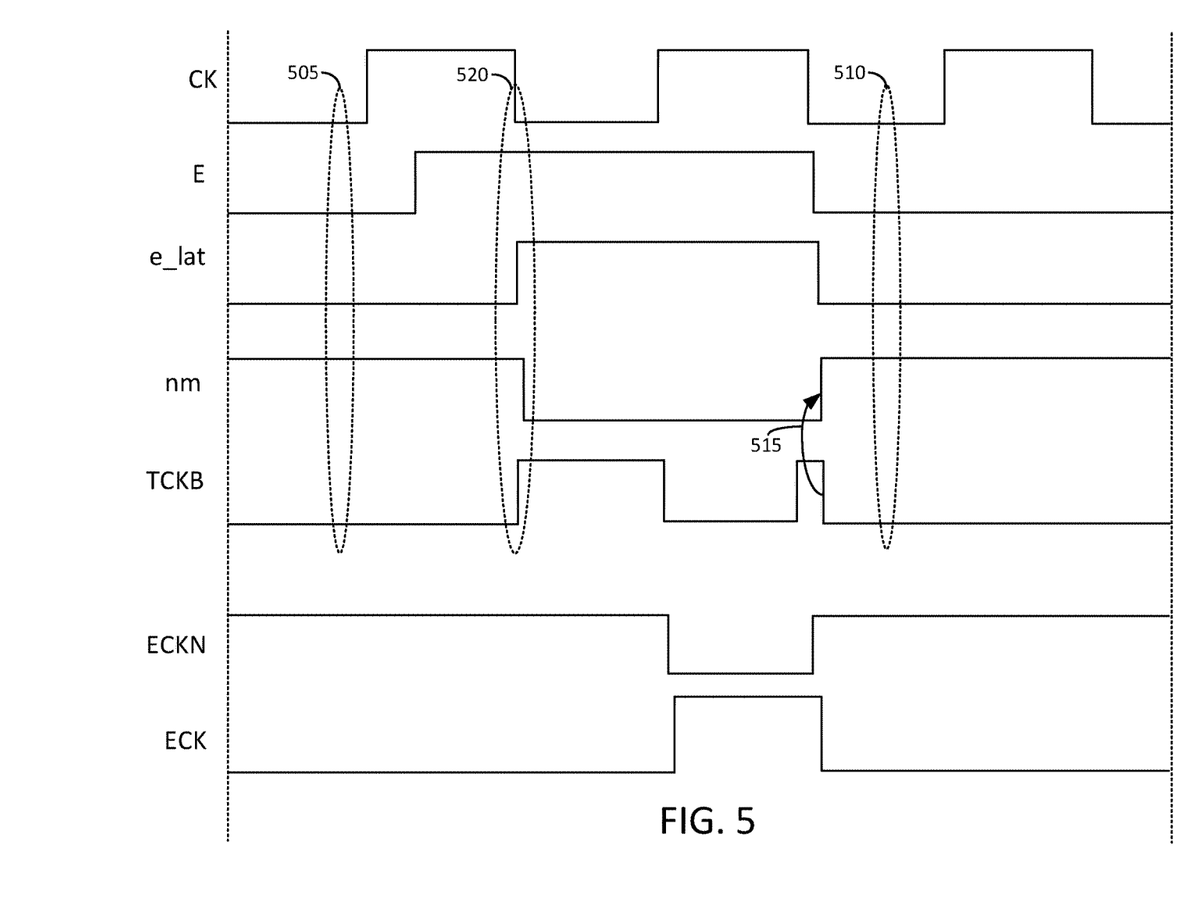
FIG. 5 is an example waveform diagram of various signals associated with the example circuit diagrams of FIGS. 3 and 4.
Figure 6:
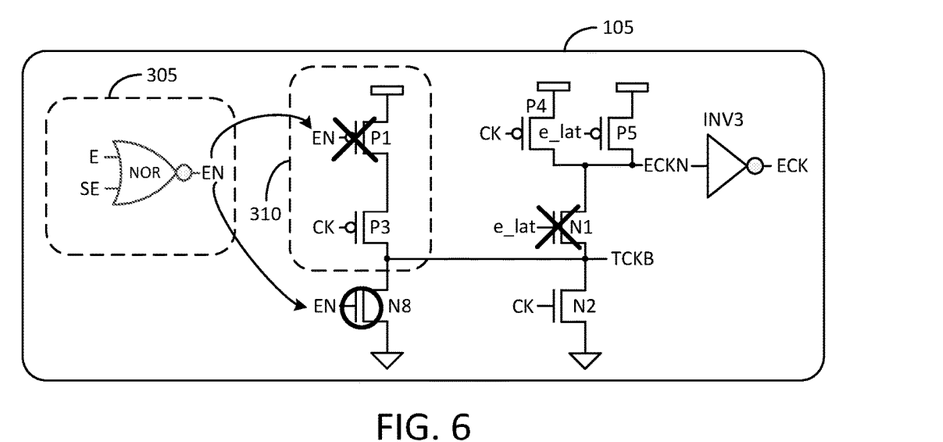
FIG. 6 shows the example circuit diagram of FIG. 3 in a particular state.
Figure 7:
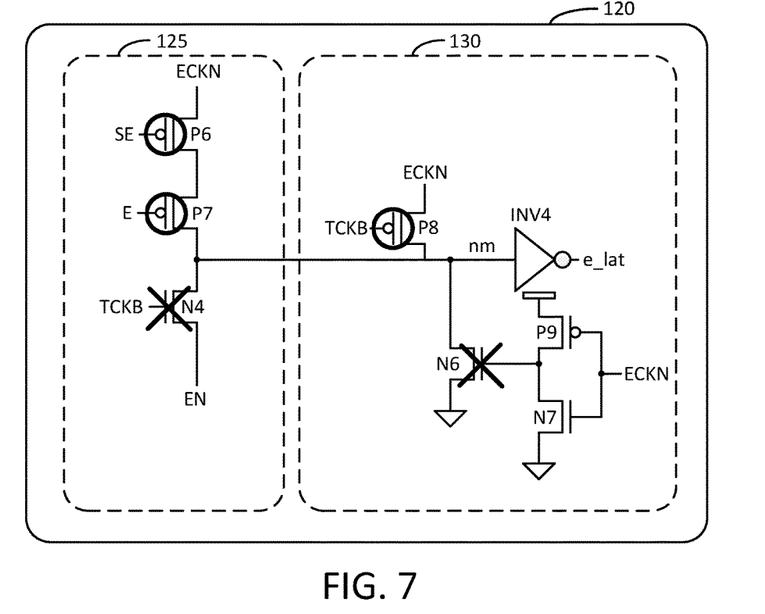
FIG. 7 shows the example circuit diagram of FIG. 4 in a particular state.

FIG. 5 is an example waveform diagram of various signals associated with the example circuit diagrams of FIGS. 3 and 4. FIG. 6 shows the example circuit diagram of FIG. 3 in a particular state. FIG. 7 shows the example circuit diagram of FIG. 4 in a particular state. Reference is now made to FIGS. 5, 6, and 7.

It will be understood that in FIGS. 6 and 7, the components that are turned off are indicated by a cross mark, while the components that are turned on are circled. In some embodiments, the clock signal CK may have a logical low value and the E signal may remain at a logical low value. As indicated in the input condition determination circuit 105, when the E signal remains at a logical low value when the clock signal CK has a logical low value, the TCKB signal does not get charged, i.e., the TCKB signal remains at a logical low value as shown at, for example, 505 and 510 in FIG. 5. Even when the TCKB signal goes to a logical high value due to noise, the input is not disrupted. As indicated in the input condition determination circuit 105 in this particular state, the PMOS transistor P1 is turned off, the NMOS transistor N8 is turned on, and the NMOS transistor N1 is turned off.

As indicated in the enable control logic circuit 125, the NOR gate passes the ECKN signal to the nm signal as long as the E signal and the SE signal remains with a logical low value. In other words, when the E signal and the SE signal have a logical low value, the ECKN signal is passed to the nm signal, as shown at 515 in FIG. 5. As indicated in the latch circuit 130, the nm signal tracks the ECKN signal since the TCKB signal has a logical low value, which turns on the PMOS transistor P8. Even if the TCKB signal goes to high, the nm signal still gets the input from the EN signal that is output from the NOR gate of the NOR logic circuit 305. In other words, the low power ICG cell 100 may pass the EN signal and/or the ECKN signal as inputs to the latch of the latch circuit 130. As indicated in the enable control logic circuit 125 in this particular state, the PMOS transistor P6 is turned on, the PMOS transistor P7 is turned on, and the NMOS transistor N4 is turned off. As indicated in the latch circuit 130 in this particular state, the PMOS transistor P8 is turned on and the NMOS transistor N6 is turned off.

Figure 8:
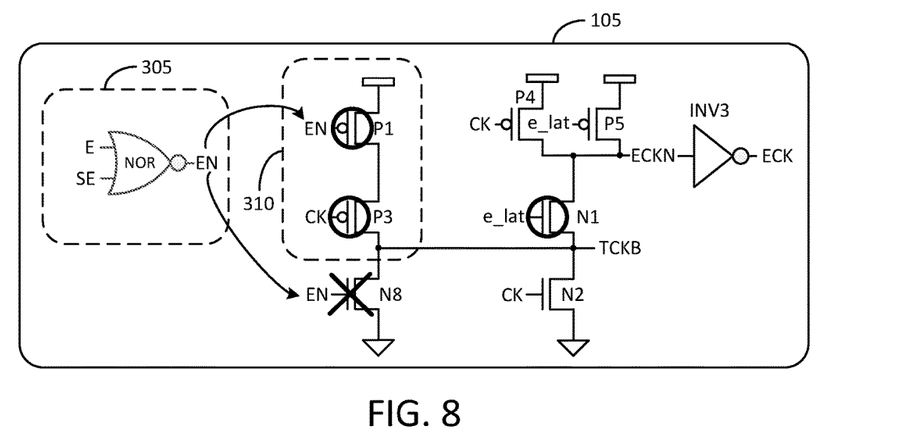
FIG. 8 shows the example circuit diagram of FIG. 3 in a particular different state.
Figure 9:
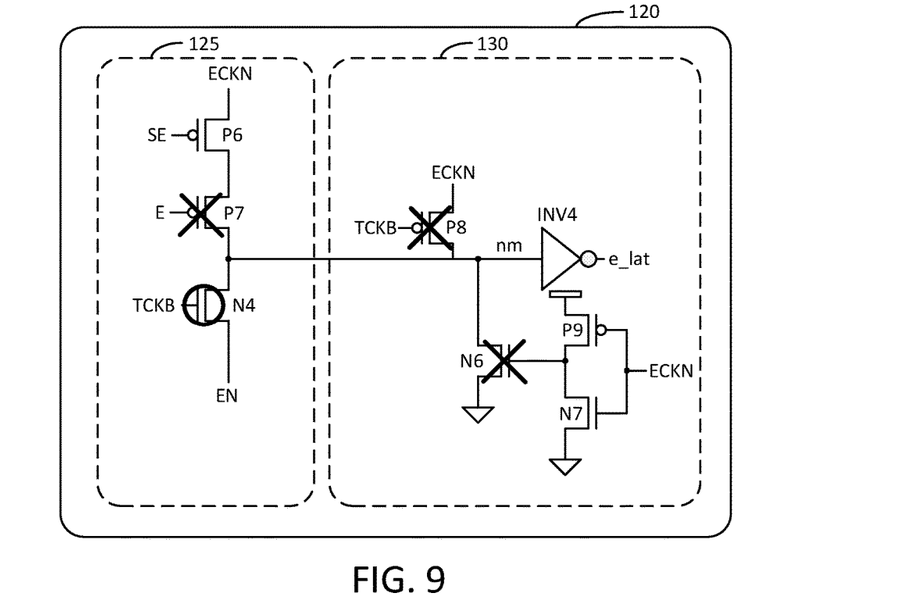
FIG. 9 shows the example circuit diagram of FIG. 4 in a particular different state.

FIG. 8 shows the example circuit diagram of FIG. 3 in a particular different state. FIG. 9 shows the example circuit diagram of FIG. 4 in a particular different state. Reference is now made to FIGS. 5, 8, and 9. These figures describe a scenario when the clock signal CK has a logical low value and the E signal remains with a logical high value, as shown at 520 in FIG. 5. As indicated by input condition determination circuit 105, when the E signal has a logical high value when the clock signal CK goes to a logical low value, the EN signal goes to a logical low value and the TCKB signal gets charged.

As indicated by the enable control logic circuit 125, the PMOS transistor P7 is off and the ECKN signal does not pass to the latch of the latch circuit 130. The TCKB signal turns on the NMOS transistor N4 to pass the EN signal to the latch of the latch circuit 130. As indicated in the latch circuit 130, the EN signal has a logical low value and acts as ground. The nm signal is discharged through the NMOS transistor N4 only. As indicated in the input condition determination circuit 105 in this particular state, the PMOS transistor P1 is turned on, the PMOS transistor P3 is turned on, the NMOS transistor N1 is turned on, and the NMOS transistor N8 is turned off. As indicated in the enable control logic circuit 125 in this particular state, the PMOS transistor P7 is turned off and the NMOS transistor N4 is turned on. As indicated in the latch circuit 130 in this particular state, the PMOS transistor P8 is turned off and the NMOS transistor N6 is turned off.

According to some embodiments, the low power ICG cell 100 disclosed herein generates the ECKN signal and the TCKB signal dependent only on an inverted enable (EN) signal and the clock signal CK. The TCKB signal acts as a temporary inverted clock signal CK when the clock signal CK has a logical low value and the E signal has a logical high value. Instead of using a conventional transmission gate PMOS to pass the input to the latch, the present low power ICG cell 100 may pass the ECKN signal to the latch of the latch circuit 130 directly through the PMOS transistors P6 and P7. This saves clocking power by reducing clock pin capacitance. Once the clock signal CK goes to a logical high value, the nm signal is shorted to ECKN dependent on the TCKB signal.

Since the ECKN signal acts as an inverted latched enable (e_lat) signal, the ECKN signal may be shorted to the nm signal when the clock signal CK goes to a logical high value. According to one embodiment, the present low power ICG cell uses a TCKB signal that is generated dependent on an EN signal and a clock signal CK so that the TCKB signal only charges when the EN signal has a logical low value. The ECKN signal may be generated using the clock signal CK and the E_lat signal, where the ECKN signal and TCKB signal are used to control a latch of the latch circuit 130.

The low power ICG cell 100 disclosed herein provides simplified complex internal latch control logic with enable and ECKN signals. It reduces the required power and area. The latch control logic disclosed herein requires no new internally generated additional signals, and may use only input and/or output signals that exist. The low power ICG cell 100 disclosed herein may generate an inverted clock based on the input only and internal signal to control the circuit. The low power ICG cell 100 disclosed herein may generate the ECKN signal and a new internal control signal (e.g., TCKB) using an inverted enable signal (e.g., EN) and clock signal CK only.

The TCKB signal acts as an inverted clock signal CK when the clock signal CK is low and enable is high. For example, the low power ICG cell 100 may use the controlled inverted clock signal (i.e., TCKB) and the ECKN signal to control the latch of the latch circuit 130. Instead of having a conventional transmission gate PMOS pass the input to the latch, the low power ICG cell 100 disclosed herein may pass an existing ECKN signal to the latch directly through PMOS transistors P6 and P7 as described above. This saves clocking power by reducing the clock pin capacitance, thereby improving overall performance. Once the clock signal CK goes high, the nm (i.e., the inverted internal latch) is shorted to ECKN via the TCKB (i.e., inverted clock) signal.

Since the ECKN signal may act as an inverted e_lat (i.e., latched signal), it can be shorted to nm (i.e., inverted latched signal) when the clock signal CK goes high. The low power ICG cell 100 disclosed herein may produce the inverted clock only when it is needed. The ECKN signal may be high even when the clock signal CK is high if the internal latch is low, but because the ECKN signal is connected to the NMOS of the input tristate, it doesn't corrupt the data. The low power ICG cell 100 disclosed herein provides better setup and lower enabled off clocking power with smaller area. Instead of charging an inverted clock every time the clock signal CK is low, it may charge high only when enable is high. In other words, the temporary inverted CK doesn't get generated when it is disabled thus saving unnecessary toggling power.

Referring to FIGS. 2A, 2B, 3, and 4, a low power integrated clock gating cell 100 may include an input condition determination circuit 105 configured to generate a temporary inverted clock signal TCKB and an inverted output signal ECKN. The low power ICG cell 100 may include an enable control logic circuit 125 configured to receive the temporary inverted clock signal TCKB and the inverted output signal ECKN from the input condition determination circuit 105. The low power ICG cell 100 may include a latch circuit 130 coupled to the enable control logic circuit 125 and configured to latch an input value dependent on at least the inverted output signal ECKN and the temporary inverted clock signal TCKB.

Referring to FIGS. 3 and 4, the enable control logic circuit 125 may include a first transistor P6 configured to receive a scan enable signal SE, a second transistor P7 coupled in series to the first transistor P6 and configured to receive an enable signal E, and a third transistor N4 coupled in series to the second transistor P7 and configured to receive the temporary inverted clock signal TCKB. The first transistor may be a PMOS transistor. The second transistor may be a PMOS transistor. The third transistor may be an NMOS transistor.

The latch circuit 120 may include an inverter INV4. A first transistor P8 of the latch circuit 130 may be coupled to the inverter INV4 and configured to receive the temporary inverted clock signal TCKB at its gate, and to pass the inverted output signal ECKN. A second transistor P9 may be configured to receive the inverted output signal ECKN at its gate. A third transistor N7 may be configured to receive the inverted output signal ECKN at its gate. A fourth transistor N6 may be coupled to the inverter INV4 and to the second and third transistors P9 and P7. The first transistor P8 may be a PMOS transistor. The second transistor P9 may be a PMOS transistor. The third transistor N7 may be an NMOS transistor. The fourth transistor N6 may be an NMOS transistor.

The input condition determination circuit 105 may include a NOR gate configured to receive the enable signal E and the scan enable signal SE, and to generate an inverted enable signal EN dependent on the enable signal E and the scan enable signal SE. A first transistor P1 of the input condition determination circuit 105 may be configured to receive the inverted enable signal EN. A second transistor P3 may be coupled in series to the first transistor P1 and configured to receive a clock signal CK. A third transistor N8 may be coupled in series to the second transistor P3 and configured to receive the inverted enable signal EN. The first transistor of the input condition determination circuit 105 may be a PMOS transistor. The second transistor P3 of the input condition determination circuit 105 may be a PMOS transistor. The third transistor N8 of the input condition determination circuit 105 may be an NMOS transistor.

The input condition determination circuit 105 may further include a fourth transistor P4 configured to receive the clock signal CK. A fifth transistor P5 may be coupled in parallel to the fourth transistor P4. The input condition determination circuit 105 may further include a sixth transistor N1. A seventh transistor N2 may be coupled in series to the sixth transistor N1, and configured to receive the clock signal CK. The fourth transistor P4 of the input condition determination circuit 105 may be a PMOS transistor. The fifth transistor P5 of the input condition determination circuit 105 may be a PMOS transistor. The sixth transistor N1 of the input condition determination circuit 105 may be an NMOS transistor. The seventh transistor N2 of the input condition determination circuit 105 may be an NMOS transistor. The input condition determination circuit 105 may be configured to generate the temporary inverted clock signal TCKB only when it is needed.

Referring to FIGS. 2A and 2B, the input condition determination circuit 105 is configured to generate the temporary inverted clock signal TCKB only when it is needed by the latch circuit 130. The enable control logic circuit 125 may include a first transistor P6 configured to receive a scan enable signal SE. A second transistor P7 coupled in series to the first transistor P6 may be configured to receive an enable signal E. A third transistor N3 may be configured to receive the scan enable signal SE. A fourth transistor N4 may be coupled in parallel to the third transistor N3 and be configured to receive the enable signal E. A fifth transistor N5 may be configured to receive the temporary inverted clock signal TCKB. The first transistor P6 may be a PMOS transistor. The second transistor P7 may be a PMOS transistor. The third transistor N3 may be an NMOS transistor. The fourth transistor N4 may be an NMOS transistor. The fifth transistor N5 may be an NMOS transistor.

The input condition determination circuit 105 may include a first inverter INV1 configured to receive the enable signal E, and to generate an inverted enable signal EN. A second inverter INV2 may be configured to receive the scan enable signal SE, and to generate an inverted scan enable signal SEN. A first transistor P1 may be configured to receive the inverted enable signal EN. A second transistor P2 may be configured to receive the inverted scan enable signal SEN. A third transistor P3 may be configured to receive a clock signal CK. A fourth transistor N2 may be coupled in series to the third transistor P3 and configured to receive the clock signal CK. The first transistor P1 of the input condition determination circuit 105 may be PMOS transistor. The second transistor P2 of the input condition determination circuit 105 may be a PMOS transistor. The third transistor P3 of the input condition determination circuit 105 may be a PMOS transistor. The fourth transistor N2 of the input condition determination circuit is an NMOS transistor.

The input condition determination circuit 105 may further include a fifth transistor P4 configured to receive the clock signal CK, a sixth transistor P5 coupled in parallel to the fifth transistor P4, and a seventh transistor N1 coupled in series to the fifth and sixth transistors P4 and P5. The fifth transistor P4 of the input condition determination circuit may be a PMOS transistor. The sixth transistor P5 of the input condition determination circuit 105 may be a PMOS transistor. The seventh transistor N1 of the input condition determination circuit 105 may be an NMOS transistor.

Figure 10:
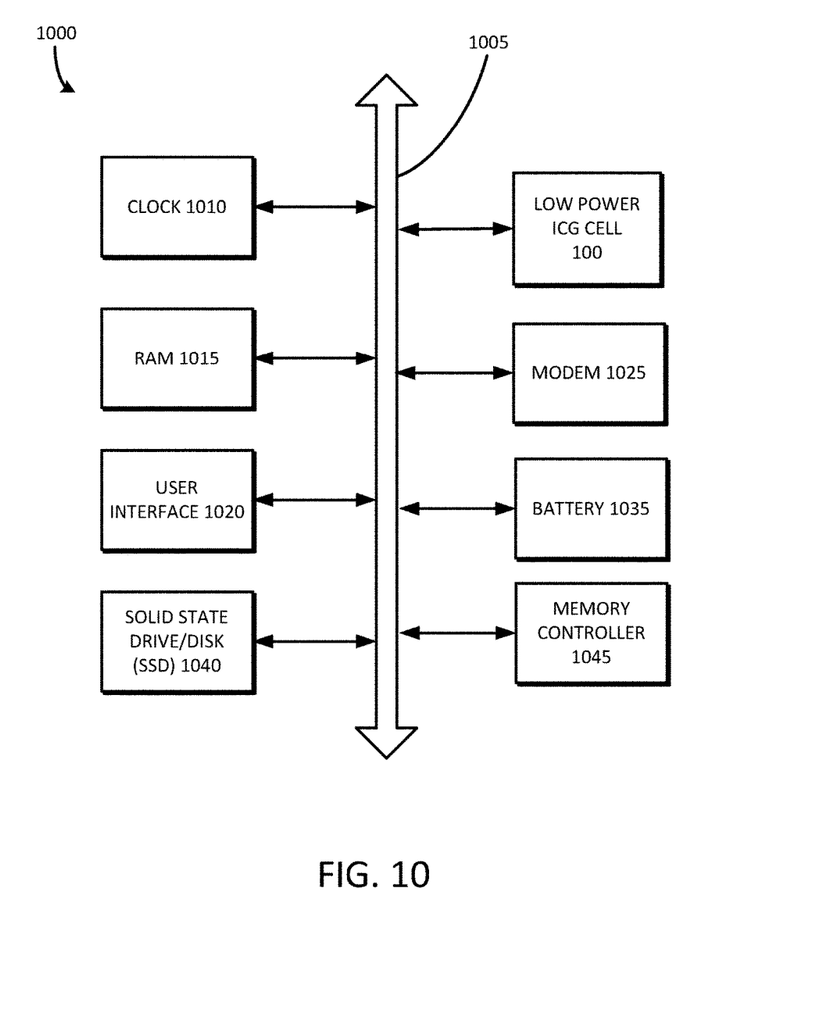
FIG. 10 is an example block diagram of a computer system including the low power integrated clock gating cell of FIG. 1 in accordance with some embodiments.

FIG. 10 is an example block diagram of a computer system 1000 including the low power ICG 100 cell of FIG. 1 in accordance with some embodiments. Referring to FIG. 10, the computing system 1000 may also include a clock 1010, a random access memory (RAM) 1015, a user interface 1020, a modem 1025 such as a baseband chipset, a solid state drive/disk (SSD) 1040, a memory controller 1045, and/or a battery 1035, any or all of which may be electrically coupled to a system bus 1005. The system 1000 including the low power ICG cell 100 may correspond to those embodiments described in detail above, and may also be electrically coupled to the system bus 1005.

If the computing system 1000 is a mobile device, the battery 1035 may power the computing system 1000. Although not shown in FIG. 10, the computing system 1000 may further include an application chipset, a camera image processor (CIS), a mobile DRAM, and the like.

In example embodiments, the computing system 1000 may be used as a computer, computer server, server rack, portable computer, Ultra Mobile PC (UMPC), workstation, net-book, PDA, web tablet, wireless phone, mobile phone, smart phone, e-book, PMP (portable multimedia player), digital camera, digital audio recorder/player, digital picture/video recorder/player, portable game machine, navigation system, black box, 3-dimensional television, a device capable of transmitting and receiving information at a wireless circumstance, one of various electronic devices constituting home network, one of various electronic devices constituting computer network, one of various electronic devices constituting a telematics network, RFID, or one of various electronic devices constituting a computing system.

Embodiments are described herein, and illustrated in the drawings, in terms of functional blocks, units and/or modules. Those skilled in the art will appreciate that these blocks, units and/or modules can be physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the present disclosure. Further, the blocks, units and/or modules of the embodiments may be physically combined into more complex blocks, units and/or modules without departing from the scope of the present disclosure.

The following discussion is intended to provide a brief, general description of a suitable machine or machines in which certain aspects of the present disclosure can be implemented. Typically, the machine or machines include a system bus to which is attached processors, memory, e.g., random access memory (RAM), read-only memory (ROM), or other state preserving medium, storage devices, a video interface, and input/output interface ports. The machine or machines can be controlled, at least in part, by input from conventional input devices, such as keyboards, mice, etc., as well as by directives received from another machine, interaction with a virtual reality (VR) environment, biometric feedback, or other input signal. As used herein, the term "machine" is intended to broadly encompass a single machine, a virtual machine, or a system of communicatively coupled machines, virtual machines, or devices operating together. Exemplary machines include computing devices such as personal computers, workstations, servers, portable computers, handheld devices, telephones, tablets, etc., as well as transportation devices, such as private or public transportation, e.g., automobiles, trains, cabs, etc.

The machine or machines can include embedded controllers, such as programmable or non-programmable logic devices or arrays, Application Specific Integrated Circuits (ASICs), embedded computers, smart cards, and the like. The machine or machines can utilize one or more connections to one or more remote machines, such as through a network interface, modem, or other communicative coupling. Machines can be interconnected by way of a physical and/or logical network, such as an intranet, the Internet, local area networks, wide area networks, etc. One skilled in the art will appreciate that network communication can utilize various wired and/or wireless short range or long range carriers and protocols, including radio frequency (RF), satellite, microwave, Institute of Electrical and Electronics Engineers (IEEE) 545.11, Bluetooth®, optical, infrared, cable, laser, etc.

Embodiments can be described by reference to or in conjunction with associated data including functions, procedures, data structures, application programs, etc. which when accessed by a machine results in the machine performing tasks or defining abstract data types or low-level hardware contexts. Associated data can be stored in, for example, the volatile and/or non-volatile memory, e.g., RAM, ROM, etc., or in other storage devices and their associated storage media, including hard-drives, floppy-disks, optical storage, tapes, flash memory, memory sticks, digital video disks, biological storage, etc. Associated data can be delivered over transmission environments, including the physical and/or logical network, in the form of packets, serial data, parallel data, propagated signals, etc., and can be used in a compressed or encrypted format. Associated data can be used in a distributed environment, and stored locally and/or remotely for machine access.

Having described and illustrated the principles of the present disclosure with reference to illustrated embodiments, it will be recognized that the illustrated embodiments can be modified in arrangement and detail without departing from such principles, and can be combined in any desired manner. And although the foregoing discussion has focused on particular embodiments, other configurations are contemplated. In particular, even though expressions such as "according to an embodiment" or the like are used herein, these phrases are meant to generally reference embodiment possibilities, and are not intended to limit the present disclosure to particular embodiment configurations. As used herein, these terms can reference the same or different embodiments that are combinable into other embodiments.

Embodiments of the present disclosure may include a non-transitory machine-readable medium comprising instructions executable by one or more processors, the instructions comprising instructions to perform the elements of the embodiments as described herein.

Consequently, in view of the wide variety of permutations to the embodiments described herein, this detailed description and accompanying material is intended to be illustrative only, and should not be taken as limiting the scope of the embodiments. What is claimed as the present system and method, therefore, is all such modifications as may come within the scope of the following claims and equivalents thereto.

What is claimed is:

1. An integrated clock gating cell, comprising:
   an input condition determination circuit configured to generate a temporary inverted clock signal and an inverted output signal;
   an enable control logic circuit configured to receive the temporary inverted clock signal and the inverted output signal from the input condition determination circuit; and
   a latch circuit coupled to the enable control logic circuit and configured to latch an input value dependent on at least the inverted output signal and the temporary inverted clock signal;
   wherein the enable control logic circuit comprises:
   a first transistor configured to receive a scan enable signal;
   a second transistor coupled in series to the first transistor and configured to receive an enable signal; and
   a third transistor coupled in series to the second transistor and configured to receive the temporary inverted clock signal.

2. The integrated clock gating cell of claim 1, wherein:
   the first transistor is a P-type metal-oxide-semiconductor (PMOS) transistor;
   the second transistor is a PMOS transistor; and
   the third transistor is an N-type metal-oxide-semiconductor (NMOS) transistor.

3. An integrated clock gating cell, comprising:
   an input condition determination circuit configured to generate a temporary inverted clock signal and an inverted output signal;
   an enable control logic circuit configured to receive the temporary inverted clock signal and the inverted output signal from the input condition determination circuit; and
   a latch circuit coupled to the enable control logic circuit and configured to latch an input value dependent on at least the inverted output signal and the temporary inverted clock signal;
   wherein the latch circuit comprises:
   an inverter;
   a first transistor coupled to the inverter and configured to receive the temporary inverted clock signal at its gate, and to pass the inverted output signal;
   a second transistor configured to receive the inverted output signal at its gate;
   a third transistor configured to receive the inverted output signal at its gate; and
   a fourth transistor coupled to the inverter and to the second and third transistors.

4. The integrated clock gating cell of claim 3, wherein:
   the first transistor is a P-type metal-oxide-semiconductor (PMOS) transistor;
   the second transistor is a PMOS transistor;
   the third transistor is an N-type metal-oxide-semiconductor (NMOS) transistor; and
   the fourth transistor is an NMOS transistor.

5. The integrated clock gating cell of claim 1, wherein the input condition determination circuit comprises:
   a NOR gate configured to receive the enable signal and the scan enable signal, and to generate an inverted enable signal dependent on the enable signal and the scan enable signal;
   a first transistor configured to receive the inverted enable signal;
   a second transistor coupled in series to the first transistor and configured to receive a clock signal; and
   a third transistor coupled in series to the second transistor and configured to receive the inverted enable signal.

6. The integrated clock gating cell of claim 5, wherein:
   the first transistor of the input condition determination circuit is a is a P-type metal-oxide-semiconductor (PMOS) transistor;
   the second transistor of the input condition determination circuit is a PMOS transistor; and
   the third transistor of the input condition determination circuit is an N-type metal-oxide-semiconductor (NMOS) transistor.

7. The integrated clock gating cell of claim 5, wherein the input condition determination circuit further comprises:
   a fourth transistor configured to receive the clock signal;
   a fifth transistor coupled in parallel to the fourth transistor;
   a sixth transistor; and
   a seventh transistor coupled in series to the sixth transistor, and configured to receive the clock signal.

8. The integrated clock gating cell of claim 7, wherein:
   the fourth transistor of the input condition determination circuit is a P-type metal-oxide-semiconductor (PMOS) transistor;
   the fifth transistor of the input condition determination circuit is a PMOS transistor;
   the sixth transistor of the input condition determination circuit is an N-type metal-oxide-semiconductor (NMOS) transistor; and
   the seventh transistor of the input condition determination circuit is an NMOS transistor.

9. The integrated clock gating cell of claim 1, wherein the input condition determination circuit is configured to generate the temporary inverted clock signal only when it is needed.

10. An integrated clock gating cell, comprising:
    an input condition determination circuit configured to generate a temporary inverted clock signal and an inverted output signal;
    an enable control logic circuit configured to receive the temporary inverted clock signal and the inverted output signal from the input condition determination circuit; and
    a latch circuit coupled to the enable control logic circuit and configured to latch an input value dependent on at least the inverted output signal and the temporary inverted clock signal,
    wherein the latch circuit includes a latch that is coupled to the enable control logic circuit;

wherein the input condition determination circuit is configured to generate the temporary inverted clock signal only when it is needed by the latch circuit; and wherein the latch circuit comprises:

an inverter;

a first transistor coupled to the inverter and configured to receive the temporary inverted clock signal at its gate, and to pass the inverted output signal;

a second transistor configured to receive the inverted output signal at its gate;

a third transistor configured to receive the inverted output signal at its gate; and a fourth transistor coupled to the inverter and to the second and third transistors.

11. An integrated clock gating cell, comprising:

an input condition determination circuit configured to generate a temporary inverted clock signal and an inverted output signal;

an enable control logic circuit configured to receive the temporary inverted clock signal and the inverted output signal from the input condition determination circuit; and a latch circuit coupled to the enable control logic circuit and configured to latch an input value dependent on at least the inverted output signal and the temporary inverted clock signal, wherein the latch circuit includes a latch that is coupled to the enable control logic circuit;

wherein the input condition determination circuit is configured to generate the temporary inverted clock signal only when it is needed by the latch circuit; and wherein the enable control logic circuit comprises:

a first transistor configured to receive a scan enable signal;

a second transistor coupled in series to the first transistor and configured to receive an enable signal;

a third transistor configured to receive the scan enable signal;

a fourth transistor coupled in parallel to the third transistor and configured to receive the enable signal; and a fifth transistor configured to receive the temporary inverted clock signal.

12. The integrated clock gating cell of claim 11, wherein:

the first transistor is a P-type metal-oxide-semiconductor (PMOS) transistor;

the second transistor is a PMOS transistor;

the third transistor is an N-type metal-oxide-semiconductor (NMOS) transistor;

the fourth transistor is an NMOS transistor; and the fifth transistor is an NMOS transistor.

13. The integrated clock gating cell of claim 10, wherein:

the first transistor is a P-type metal-oxide-semiconductor (PMOS) transistor;

the second transistor is a PMOS transistor;

the third transistor is an N-type metal-oxide-semiconductor (NMOS) transistor; and the fourth transistor is an NMOS transistor.

14. The integrated clock gating cell of claim 11, wherein the input condition determination circuit comprises:

a first inverter configured to receive the enable signal, and to generate an inverted enable signal;

a second inverter configured to receive the scan enable signal, and to generate an inverted scan enable signal;

a first transistor configured to receive the inverted enable signal;

a second transistor configured to receive the inverted scan enable signal;

a third transistor configured to receive a clock signal; and a fourth transistor coupled in series to the third transistor and configured to receive the clock signal.

15. The integrated clock gating cell of claim 14, wherein:

the first transistor of the input condition determination circuit is a is a P-type metal-oxide-semiconductor (PMOS) transistor;

the second transistor of the input condition determination circuit is a PMOS transistor;

the third transistor of the input condition determination circuit is a PMOS transistor; and the fourth transistor of the input condition determination circuit is an N-type metal-oxide-semiconductor (NMOS) transistor.

16. The integrated clock gating cell of claim 14, wherein the input condition determination circuit further comprises:

a fifth transistor configured to receive the clock signal;

a sixth transistor coupled in parallel to the fifth transistor; and a seventh transistor coupled in series to the fifth and sixth transistors.

17. The integrated clock gating cell of claim 16, wherein:

the fifth transistor of the input condition determination circuit is a P-type metal-oxide-semiconductor (PMOS) transistor;

the sixth transistor of the input condition determination circuit is a PMOS transistor; and the seventh transistor of the input condition determination circuit is an N-type metal-oxide-semiconductor (NMOS) transistor.

* * * * *